United States Patent
Huang et al.

(10) Patent No.: US 7,217,581 B2
(45) Date of Patent: May 15, 2007

(54) MISALIGNMENT TEST STRUCTURE AND METHOD THEREOF

(75) Inventors: Chien-Chang Huang, Kueishan (TW); Tie-Jiang Wu, Kueishan (TW); Chin-Ling Huang, Kueishan (TW); Yu-Wei Ting, Kueishan (TW); Bo-Ching Jiang, Kueishan (TW)

(73) Assignee: Nanya Technology Corporation, Kueishan Taoyuan (TW)

( * ) Notice: Subject to any disclaimer, the term of this patent is extended or adjusted under 35 U.S.C. 154(b) by 0 days.

(21) Appl. No.: 11/339,687

(22) Filed: Jan. 26, 2006

(65) Prior Publication Data

US 2006/0128041 A1   Jun. 15, 2006

Related U.S. Application Data

(62) Division of application No. 10/718,612, filed on Nov. 24, 2003, now Pat. No. 7,015,050.

(30) Foreign Application Priority Data

Dec. 27, 2002   (TW) ............................... 91137752 A

(51) Int. Cl.
*H01L 21/00* (2006.01)
(52) U.S. Cl. .............................. 438/16; 438/14; 438/17
(58) Field of Classification Search .................. 438/16, 438/14, 17
See application file for complete search history.

(56) References Cited

U.S. PATENT DOCUMENTS

| | | | |
|---|---|---|---|
| 6,080,597 A * | 6/2000 | Moon ........................... | 438/17 |
| 6,294,909 B1 | 9/2001 | Leedy | |
| 6,305,095 B1 * | 10/2001 | Look et al. .................... | 33/645 |
| 6,393,714 B1 * | 5/2002 | Look et al. .................... | 33/645 |
| 6,436,726 B2 * | 8/2002 | Look et al. .................... | 438/17 |
| 6,684,520 B1 * | 2/2004 | Look et al. .................... | 33/645 |
| 6,790,685 B2 | 9/2004 | Lee | |
| 6,878,561 B2 * | 4/2005 | Look et al. .................... | 438/14 |
| 7,015,050 B2 * | 3/2006 | Huang et al. .................. | 438/14 |
| 2001/0049881 A1 * | 12/2001 | Look et al. .................... | 33/645 |
| 2003/0096436 A1 | 5/2003 | Satya et al. | |
| 2003/0139509 A1 | 7/2003 | Yamaguchi | |
| 2004/0072398 A1 * | 4/2004 | Look et al. .................. | 438/200 |
| 2004/0124412 A1 * | 7/2004 | Huang et al. .................. | 257/48 |
| 2005/0176174 A1 | 8/2005 | Leedy | |
| 2006/0128041 A1 * | 6/2006 | Huang et al. .................. | 438/17 |

* cited by examiner

*Primary Examiner*—Laura M. Schillinger
(74) *Attorney, Agent, or Firm*—Birch, Stewart, Kolasch & Birch, LLP

(57) ABSTRACT

A test structure and a test method for determining misalignment occurring in integrated circuit manufacturing processes are provided. The test structure includes a first conductive layer having a first testing structure and a second testing structure, a dielectric layer thereon, and a second conductive layer on the dielectric layer. The second conductive layer includes a third testing structure and a fourth testing structure, which respectively overlap a portion of the first testing structure and the second testing structure in a first direction and a second direction. The first direction is opposite to the second direction. The method includes a step of measuring the electrical characteristic between the first and the second conductive layers to calculate an offset amount caused by the misalignment.

8 Claims, 3 Drawing Sheets

MISALIGNMENT TEST STRUCTURE AND METHOD THEREOF

CROSS REFERENCE TO RELATED APPLICATIONS

This application is a Divisional of application Ser. No. 10/718,612, filed on Nov. 24, 2003, which issued on Mar. 21, 2006 as U.S. Pat. No. 7,015,050, and for which priority is claimed under 35 U.S.C. § 120; and this application claims priority of Application No. 091137752 filed in Taiwan, R.O.C. on Dec. 27, 2002, under 35 U.S.C. § 119; the entire contents of all are hereby incorporated by reference.

FIELD OF THE INVENTION

The present invention relates to determining process misalignment during manufacturing of an integrated circuit, and more particularly, to a test structure and a test method for determining misalignment during a photolithographic process by calculations base on electrical characteristic measurement.

BACKGROUND OF THE INVENTION

Photolithography is an important process for pattern transferring during manufacturing an integrated circuit. Therefore, the precision level of pattern stacks between layers nearly all depends on the alignment capability of the photolithographic process. Due to the limitations of the precision level of an alignment mechanism and characteristics of photoresist materials, however, there is more or less possibility that misalignment may occur. Thus, one target of industrial practices is to find a way to best-determine whether the misalignment occurs during manufacturing semiconductor components.

The test methods to determine whether the misalignment between layers occurs in the components generally include using optical examination systems, e.g. scanning electron microscope (SEM), and test structures disposed on the chips. Determining the misalignment by an optical examination system, however, requires more time and efforts, and usually does not result in enough precision due to native limitation of instrument resolution. Therefore, techniques of on-chip test structures come with the tide of fashion.

While size of the semiconductor components becomes smaller and smaller, however, the misalignment during a photolithographic process becomes more and more difficult to be verified. Due to the component size reduction, the test structure needs to not only determine whether the misalignment occurs but also quantify an offset amount and detect the direction of the misalignment for future references. Moreover, as achieving the purpose of quantifying test results, the test structure must be compatible with the current manufacturing process to monitor the process instantaneously.

To solve the problems described above, a desirable design of the test structure is needed to quantify the misalignment during the semiconductor manufacturing process.

SUMMARY OF THE INVENTION

It is an aspect of the present invention to provide a test structure for determining the misalignment during manufacturing of an integrated circuit to improve the reliability of components.

It is another aspect of the present invention to provide a test structure compatible with the current process to monitor the misalignment between a gate and an active area during manufacturing a Metal Oxide Semiconductor Field Effect Transistor (MOSFET) in a photolithographic process for future references.

It is a further aspect of the present invention to provide a test structure compatible with the current process of manufacturing integrated circuits and an offset amount can also be calculated by characteristic measurement. Such that, it can reduce the inaccuracy due to human operations and resolution limit of instruments.

It is another further aspect of the present invention to provide a test structure having two test capacitance structures respectively increasing and decreasing according to the direction of misalignment.

In accordance with an embodiment of the present invention, a test structure includes a first conductive layer, a dielectric layer and a second conductive layer. The first conductive layer includes a first finger-shaped structure and a second finger-shaped structure. The dielectric layer is disposed on the first conductive layer. The second conductive layer is disposed on the dielectric layer and includes a third finger-shaped structure and a fourth finger-shaped structure respectively corresponding to the first and the second finger-shaped structures. The third finger-shaped structure partially overlaps the first finger-shaped structure by a predetermined overlap width (W) in a first direction and the fourth finger-shaped structure partially overlaps the second finger-shaped structure by the same predetermined overlap width in a second direction. The first direction is opposite to the second direction.

The misalignment induced in a process of forming the second conductive layer causes an offset amount (W') of the third finger-shaped structure and the fourth finger-shaped structure. Therefore, the third and the fourth finger-shaped structures respectively overlap the first and the second finger-shaped structures by a first overlap width and a second overlap width. The first overlap width equals W minus W' and the second overlap width equals W plus W' while the misalignment occurs in the first direction. The first overlap width equals W plus W' and the second overlap width equals W minus W' while the misalignment occurs in the second direction.

Besides, the offset amount can be calculated by measuring electrical characteristics across the first conductive layer and the second conductive layer. For example, the first and the third finger-shaped structures have a first overlap length (L1), and the second and the fourth finger-shaped structures have a second overlap length (L2), in which L1 and L2 are respectively much larger than W (L1>>W and L2>>W). Suppose that L1 and L2 are respectively equal to an overlap length (L). Thus, W' can be calculated from the equation W'=W*(C1−C2)/(C1+C2). The C1 and the C2 are a first capacitance and a second capacitance respectively created due to the overlap between the first and the third finger-shaped structures and the overlap between the second and the fourth finger-shaped structures.

The present invention further provides a test method for determining process misalignment during manufacturing of an integrated circuit having a first conductive layer. The present invention includes patterning the first conductive layer to form a first finger-shaped structure and a second finger-shaped structure, and sequentially form a dielectric layer on the first conductive layer and a second conductive layer on the dielectric layer. Afterward, pattern the second conductive layer to form a third finger-shaped structure partially overlapping the first finger-shaped structure by a predetermined overlap width in a first direction and a fourth finger-shaped structure partially overlapping the second finger-shaped structure by a predetermined overlap width in a second direction. The first direction is opposite to the second direction. Therefore, it can be determined whether the second conductive layer is shifted during the patterning process by measuring the electrical characteristics across the first conductive layer and the second conductive layer.

The process of patterning the second conductive layer further includes forming the third and the fourth finger-shaped structures respectively overlapping the first and the second finger-shaped structures by an identical overlap length (L), in which L is much larger than the predetermined overlap width (W). The process of determining whether the misalignment layer occurs in the second conductive layer further includes calculating an offset amount (W') from the equation W'=W*(C1−C2)/(C1+C2). The C1 and the C2 are a first capacitance and a second capacitance respectively created due to the overlap between the first and the third finger-shaped structures and the overlap between the second and the fourth finger-shaped structures.

Besides, while W' is larger than zero, the second conductive layer shifts in the second direction during the patterning process. While W' is less than zero, the second conductive layer shifts in the first direction during the patterning process. While W' equals zero, the second conductive layer doesn't shift during the patterning process.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention discloses a test structure and a test method for determining a process misalignment during manufacturing an integrated circuit and calculating an offset amount created due to the misalignment. These and other features and advantages of the present invention will become more apparent by referring to the following detailed description and the appended drawings from FIG. 1 to FIG. 4.

Figure 1:
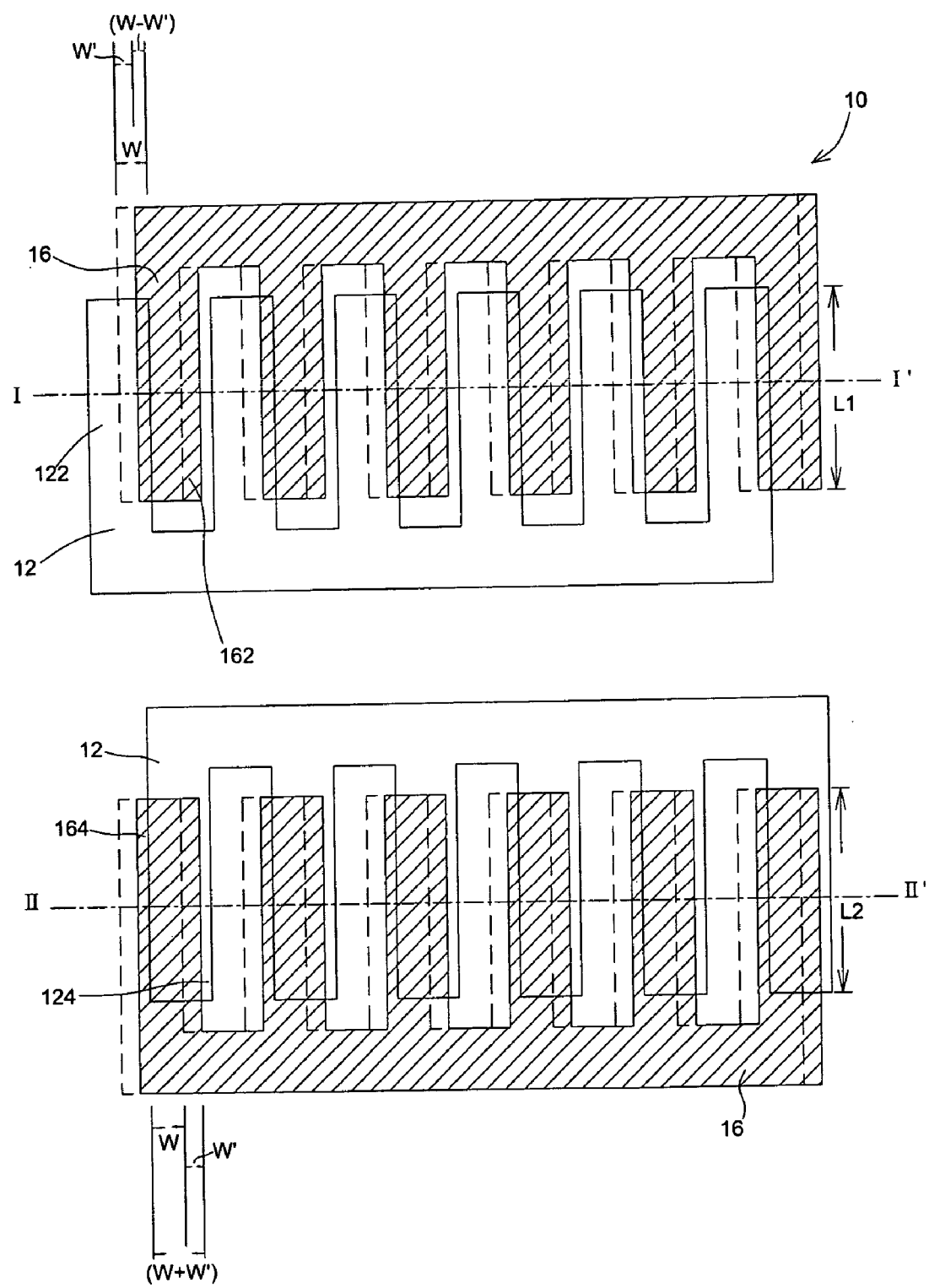
FIG. 1 is a top view of the test structure in accordance with the embodiment of the present invention.
Figure 2:
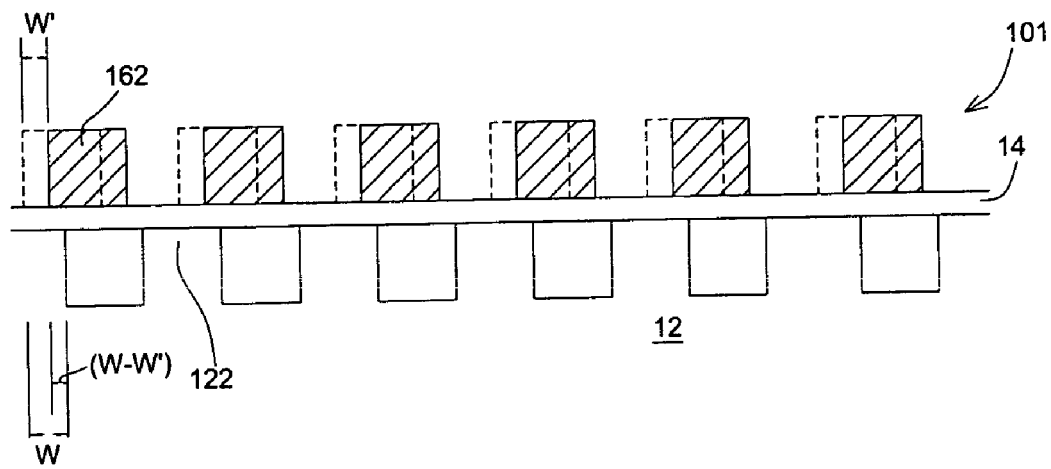
FIG. 2 is a cross-sectional view of FIG. 1 along the line I–I'.
Figure 3:
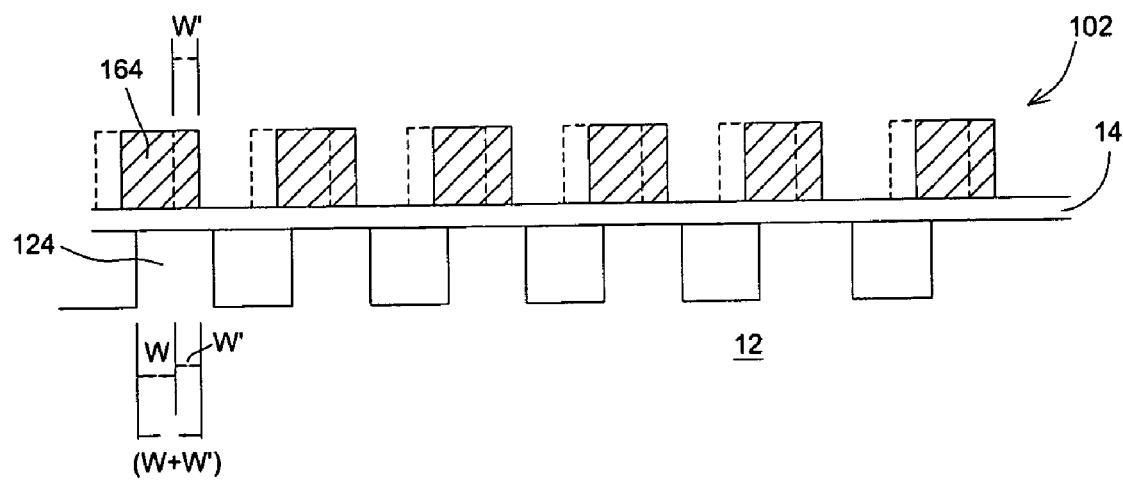
FIG. 3 is a cross-sectional view of FIG. 1 along the line II–II'.

An exemplary test structure 10 in accordance with one embodiment of the present invention is shown in FIG. 1, FIG. 2 and FIG. 3. The test structure 10 is used to determine whether a process misalignment occurs during manufacturing an integrated circuit, e.g. a misalignment between a gate and an active area in a Metal Oxide Semiconductor Field Effect Transistor (MOSFET) during a photolithographic process. FIG. 1 is a schematic top view of the test structure 10, and FIG. 2 and FIG. 3 are respectively the cross-sectional view of a portion of the test structure (101 and 102) in FIG. 1 along lines I–I' and II–II'. The test structure 10 includes a first conductive layer 12, a dielectric layer 14 (as shown in FIG. 2 and FIG. 3) and a second conductive layer 16. The first conductive layer 12 includes a first finger-shaped structure 122 and a second finger-shaped structure 124. The dielectric layer 14 is disposed on the first conductive layer 12 and covers the first finger-shaped structure 122 and the second finger-shaped structure 124. The second conductive layer 16 is disposed on the dielectric layer and includes a third finger-shaped structure 162 and a fourth finger-shaped structure 164 respectively corresponding to the first finger-shaped structure 122 and the second finger-shaped structure 124.

The third finger-shaped structure 162 partially overlaps the first finger-shaped structure 122 by a predetermined overlap width (W) in a first direction. The fourth finger-shaped structure 164 partially overlaps the second finger-shaped structure 124 by the same predetermined overlap width (W) in a second direction The first direction is opposite to the second direction. For example, the third finger-shaped structure 162 is located on the right side of the first finger-shaped structure 122 (i.e. the positive direction of x-axis), the fourth finger-shaped structure 164 is located on the left side of the second finger-shaped structure 124 (i.e. the negative direction of x-axis). Areas enclosed by dash lines in FIG. 1 represent that the third and the fourth finger-shaped structures (162 and 164) respectively partially overlap the first and the second finger-shaped structures (122 and 124) by the predetermined overlap width, and that the misalignment doesn't occur during manufacturing of the second conductive layer.

While the misalignment occurs during manufacturing of the second conductive layer, it causes an offset amount (W') of the third finger-shaped structure 162 and the fourth finger-shaped structure 164. So, the third finger-shaped structure 162 and the fourth finger-shaped structure 164 respectively overlap the first finger-shaped structure 122 and the second finger-shaped structure 124 by a first overlap width (W1) and a second overlap width (W2). For example, while the misalignment occurs in the first direction (i.e. the right side), W1 equals W minus W' and W2 equals W plus W', as illustrated by shadowed areas of the third finger-shaped structure 162 and the fourth finger-shaped structure 164 shown in FIG. 1. Besides, those skilled in the art should appreciate that W1 equals W plus W' and W2 equals W minus W' while the misalignment occurs in the second direction, although it is not illustrated in FIG. 1.

Furthermore, the first finger-shaped structure 122 and the third finger-shaped structure 162 have a first overlap length (L1). The second finger-shaped structure 124 and the fourth finger-shaped structure 164 have a second overlap length (L2), in which the first and the second overlap lengths are respectively much larger than the predetermined overlap width (i.e. L1>>W and L2>>W). In this kind of allocation, the electrical characteristic changes induced by the misalignment in other directions (e.g. an y direction perpendicular to the first and the second direction (x axis)) are negligible.

Therefore, the offset amount (W') can be calculated by the electrical characteristic measurement across the first conductive layer 12 and the second conductive layer 16. In other words, the dielectric layer 14 and the overlapping parts between the first finger-shaped structure 122 and the third finger-shaped structure 162 are gathered to form a first capacitance. Similarly, the dielectric layer 14 and the overlapping parts between the second finger-shaped structure 124 and the fourth finger-shaped structure 164 are gathered together to form a second capacitance. Thus, the offset amount (W') can be calculated from equation (1): C=k*A/d, in which the C is the capacitance, the k is the dielectric constant of the dielectric layer, the A is the area of the capacitance and the d is the thickness of the dielectric layer.

Therefore, consider a misalignment between a gate and an active area in a MOSFET during a photolithographic process as an exemplary embodiment. The first conductive layer 12, e.g. a silicon substrate, is a semiconductor substrate having transistors on it. The dielectric layer 14 and the gate dielectric layer are formed at the same time, and the second conductive layer is a gate layer. Consequently, substituting the relative data in equation (1) will obtain the capacitance C1 across the first and the third finger-shaped structures (C1=k*L1*W1/d1), in which the A in equation (1) equals L multiplied by W. The capacitance C2 across the second and the fourth finger-shaped structures can also be obtained by similar substitution (C2=k*L2*W2/d2). Suppose that L1 and L2 are respectively equal to an identical overlap length (L), i.e. L=L1=L2, as well as an identical dielectric layer thickness d, i.e. d=d1=d2. While the misalignment occurs in the first direction, i.e. W1=W−W' and W2=W+W'

$$C1=k*L*(W-W')/d \qquad \text{equation (2)}$$

$$C2=k*L*(W+W')/d \qquad \text{equation (3)}$$

so that an equation (4) can be derived from equation (3) and equation (4)

$$W'=W*(C2-C1)/(C1+C2) \qquad \text{equation (4)}$$

While the misalignment occurs in the second direction, i.e. W1=W+W' and W2=W−W'

$$C1=k*L*(W+W')/d \qquad \text{equation (5)}$$

$$C2=k*L*(W-W')/d \qquad \text{equation (6)}$$

so that an equation (7) can be derived from equation (5) and equation (6)

$$W'=W*(C1-C2)/(C1+C2) \qquad \text{equation (7)}$$

It should be noted that the direction of the misalignment can depend on whether the value of W' calculated from equation (7) is positive or negative. While W' is positive (i.e. W'>0), the misalignment occurs in the second direction during patterning the second conductive layer. While W' is negative (i.e. W'<0), the misalignment occurs in the first direction during patterning the second conductive layer. While W' equals zero (i.e. W=0), the misalignment doesn't occur during patterning the second conductive layer. Similarly, the direction of the misalignment can also depend on the value of W' calculated from equation (4), but the judgement method is opposite to equation (7). For example, while W' is positive, the misalignment occurs in the first direction during patterning the second conductive layer. While W' is negative, the misalignment occurs in the second direction during patterning the second conductive layer.

As shown in FIG. 1, the first conductive layer 12 further includes a plurality of the first finger-shaped structures 122 jointed together and a plurality of the second finger-shaped structures 124 jointed together. Furthermore, the second conductive layer 16 further includes a plurality of the third finger-shaped structures 162 jointed together and a plurality of the fourth finger-shaped structures 164 jointed together respectively corresponding to the first finger-shaped structures 122 and the second finger-shaped structures 124. Such comb-like test structures can improve the electrical characteristic measurement by increasing the number of the capacitance.

Figure 4:
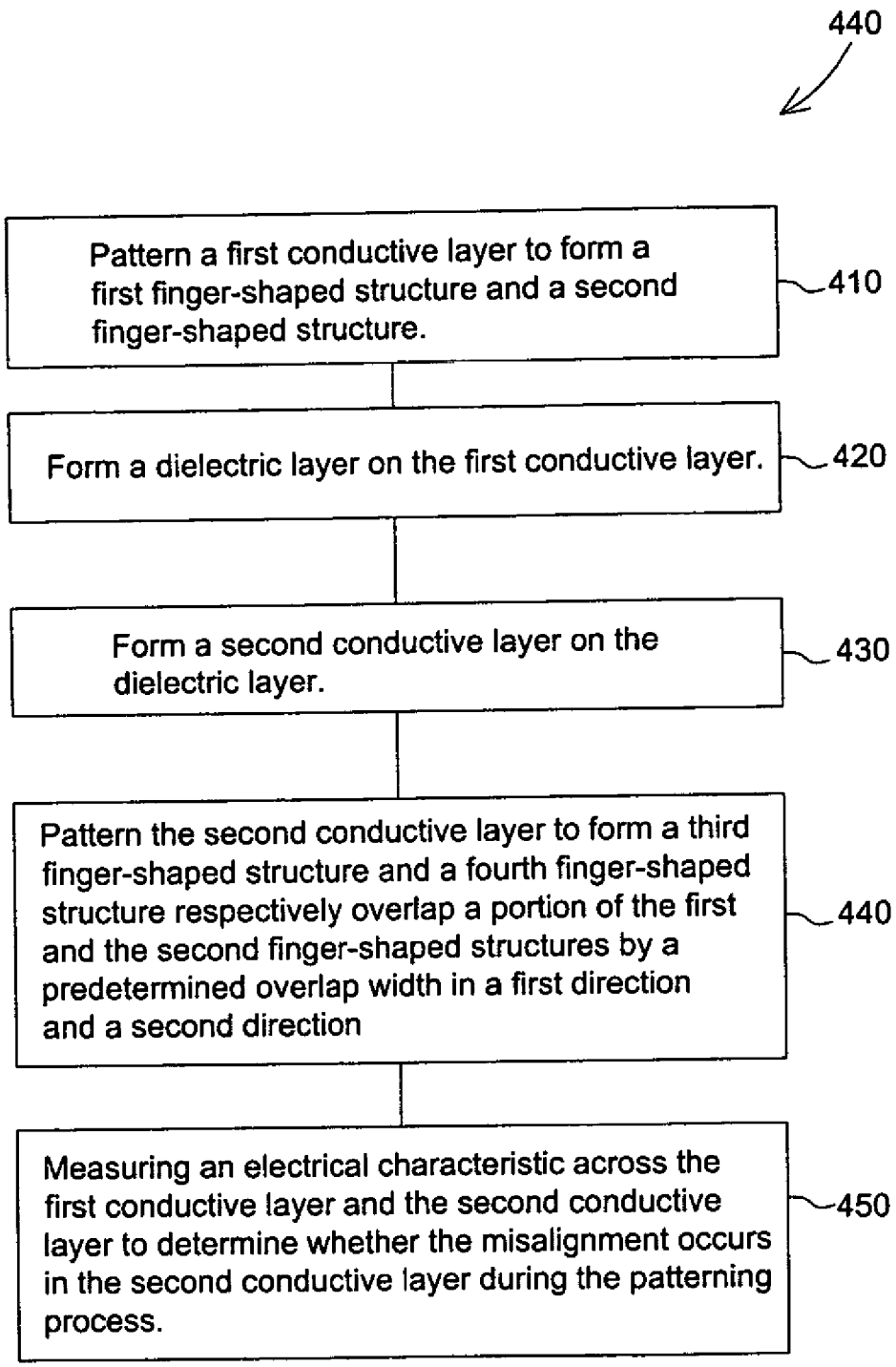
FIG. 4 is a flowchart of the test method in accordance with the embodiment of the present invention.

FIG. 4 is a flowchart 400 of a test method for determining process misalignment during manufacturing an integrated circuit in accordance with the present invention. For example, it can be a test method for determining the misalignment between a gate and an active area during a photolithographic process. The integrated circuit 10 includes a first conductive layer 12, e.g. a silicon substrate of a Metal Oxide Semiconductor Field Effect Transistor. The present invention includes a first step 410 to pattern the first conductive layer (i.e. the silicon substrate) to form a first finger-shaped structure 122 and a second finger-shaped structure 124 as shown in FIGS. 1–3. The step of patterning the first conductive layer 12 includes forming an active area of the transistor and a shallow trench isolation (not illustrated) at the same time. In other words, define the active area of the silicon substrate and the first finger-shaped structure 122 and second finger-shaped structure 124 of the first conductive layer 12 simultaneously.

After that, form a dielectric layer 14 on the first conductive layer 12 (step 420); i.e. the dielectric gate layer of the transistor represents the electric layer 14 of the test structure 10. Furthermore, form a second conductive layer 16 on the dielectric layer 14 (step 430), i.e. forming a conductive layer to be defined as a gate afterward. Next, pattern the second conductive layer 16 to form a third finger-shaped structure 162 and a fourth finger-shaped structure 164 respectively overlapping a portion of the first and the second finger-shaped structures by a predetermined overlap width (W) in a first direction and a second direction (step 440). The first direction is opposite to the second direction. In other words, define the gate of the transistor and the position of the third and the fourth finger-shaped structures at the same time. Accordingly, the portion of the overlaps between the first and the third finger-shaped structures and between the second and the fourth finger-shaped structures become a first capacitance 101 and a second capacitance 102.

Besides, the step of patterning the second conductive layer 16 further includes forming the third finger-shaped structure 162 and the fourth finger-shaped structure 164 respectively overlapping the first finger-shaped structure 122 and the second finger-shaped structure 124 by an identical overlap length (L), in which L is much larger than W. While L is much larger than W in the test structure for determining an x-axis misalignment, an offset amount of the overlap length becomes negligible compared to the predetermined overlap length. So that an electrical characteristic effect occurs in an y-axis is negligible compared to the effect in the x-axis.

Therefore, whether the misalignment occurs in the second conductive layer 16 during the patterning process can be determined by measuring an electrical characteristic across the first conductive layer 12 and the second conductive layer 16 (step 450). In other words, by determining the misalignment of the second conductive layer 16 in the test structure, whether the misalignment occurs between the gate and the active area can also be determined. The step of measuring the electrical characteristic across the first conductive layer 12 and the second conductive layer 16 includes measuring charge and discharge voltages to calculate the corresponding capacitance. The step of determining whether the misalignment occurs in the second conductive layer 16 includes calculating an offset amount (W') during patterning the second conductive layer from equation (7), W'=W*(C1−C2)/(C1+C2). The W is the predetermined overlap width. The C1 and the C2 are a first capacitance and a second capacitance respectively created due to the overlap between the first finger-shaped structure 122 and the third finger-shaped structure 162 and the overlap between the second finger-shaped structure 124 and the fourth finger-shaped structure 164. While W' is positive (i.e. W'>0), the misalignment occurs in the second direction during patterning the second conductive layer 16. While W' is negative (i.e. W'<0), the misalignment occurs in the first direction during patterning the second conductive layer 16. While W' equals zero (i.e. W=0), the misalignment doesn't occur during patterning the second conductive layer 16. Besides, whether the misalignment occurs can also be determined by the value of W' calculated from equation (4) and the judgement method is opposite to equation (7). The determining method has been described above and is not described here again.

Furthermore, the step of patterning the first conductive layer 12 further includes forming a plurality of the first finger-shaped structures 122 and a plurality of the second finger-shaped structures 124 like the comb-like structure shown in FIG. 1. Similarly, the step of patterning the second conductive layer 16 further includes forming a plurality of the third finger-shaped structures 162 and a plurality of the fourth finger-shaped structures 164 respectively overlapping a portion of the first finger-shaped structures 122 and the second finger-shaped structures 124 by the predetermined overlap width (W) in the first direction and the second direction as the overlapping comb-like structures shown in FIG. 1. It thus can improve the convenience of electrical characteristic measurement.

The above description sets forth various preferred embodiments of the invention only, and is not intended to limit the scope, applicability, or configuration of the invention in any way. Rather, various changes may be made in the function and arrangement of the elements described in these embodiments without departing from the spirit and scope of the invention. Thus, the protected scope of the present invention is as set forth in the appended claims.

What is claimed is:

1. A method of determining process misalignment during manufacturing of an integrated circuit having a first conductive layer, the method comprising:
    patterning the first conductive layer to form a first finger-shaped structure and a second finger-shaped structure;
    forming a dielectric layer on the first conductive layer;
    forming a second conductive layer on the dielectric layer;
    patterning the second conductive layer to form a third finger-shaped structure and a fourth finger-shaped structure respectively partially overlapping the first finger-shaped structure in a first direction and the second finger-shaped structure in a second direction by a predetermined overlap width (W), the first direction being opposite to the second direction;
    measuring an electrical characteristic across the first conductive layer and the second conductive layer to determine whether the second conductive layer is shifted during a patterning process.

2. The method of claim 1, wherein the step of patterning the first conductive layer further comprises forming a plurality of the first finger-shaped structures and a plurality of the second finger-shaped structures.

3. The method of claim 2, wherein the step of patterning the second conductive layer further comprises patterning the second conductive layer to form a plurality of the third finger-shaped structures and a plurality of the fourth finger-shaped structures respectively partially overlapping the first finger-shaped structures in said first direction and the second finger-shaped structures in said second direction by the predetermined overlap width.

4. The method of claim 1, wherein the step of patterning the second conductive layer further comprises forming the third and the fourth finger-shaped structures to respectively overlap the first and the second finger-shaped structures by an identical overlap length (L), and wherein the L is much larger than the W.

5. The method of claim 4, wherein the step of determining whether the second conductive layer is shifted comprises calculating an offset amount (W') of the patterned second conductive layer from the equation W'=W*(C1−C2)/(C1+C2), wherein W is the predetermined overlap width; C1 and C2 is a first capacitance and a second capacitance respectively created due to the overlap between the first and the third finger-shaped structures and the overlap between the second and the fourth finger-shaped structures.

6. The method of claim 5, wherein
    while the W' is larger than zero, the second conductive layer shifts to the second direction during a patterning process;
    while the W' is less than zero, the second conductive layer shifts to the first direction during a patterning process; and
    while the W' equals zero, the second conductive layer doesn't shift during a patterning process.

7. The method of claim 4, wherein the step of determining whether the second conductive layer is shifted comprises calculating an offset amount (W') of the patterned second conductive layer from the equation W'=W*(C2−C1)/(C1+C2), wherein W is the predetermined overlap width; C1 and C2 are a first capacitance and a second capacitance respectively created due to the overlap between the first and the third finger-shaped structures and the overlap between the second and the fourth finger-shaped structures.

8. The method of claim 7, wherein
    while the W' is larger than zero, the second conductive layer shifts to the first direction during a patterning process;
    while the W' is less than zero, the second conductive layer shifts to the second direction during a patterning process; and
    while the W' equals zero, the second conductive layer doesn't shift during a patterning process.

* * * * *